United States Patent [19]

Kamieniecki

[11] Patent Number: 4,827,212

[45] Date of Patent: May 2, 1989

[54] NONINVASIVE METHOD AND APPARATUS FOR CHARACTERIZATION OF SEMICONDUCTORS

[75] Inventor: Emil Kamieniecki, Lexington, Mass.

[73] Assignee: Semitest, Inc., Billerica, Mass.

[21] Appl. No.: 145,923

[22] Filed: Jan. 20, 1988

[51] Int. Cl.$^4$ ............................................ G01R 31/26
[52] U.S. Cl. ........................... 324/158 R; 324/158 D; 324/158 P
[58] Field of Search ............ 324/158 R, 158 P, 158 F, 324/73 R, 73 AT, 73 PC, 158 D, 158 T

[56] References Cited

U.S. PATENT DOCUMENTS

| | | | |
|---|---|---|---|
| 3,437,929 | 4/1969 | Glenn | 324/158 P |
| 4,286,215 | 8/1981 | Miller | 324/158 D |
| 4,333,051 | 6/1982 | Goodman | 324/158 D |
| 4,393,348 | 7/1983 | Goldstein | 324/158 D |
| 4,433,288 | 2/1984 | Moore | 324/158 D |
| 4,544,887 | 10/1985 | Kamieniecki | 324/158 R |
| 4,567,431 | 1/1986 | Goodman | 324/158 D |
| 4,578,641 | 3/1986 | Tiedje | 324/158 D |
| 4,598,249 | 7/1986 | Goodman | 324/158 D |

*Primary Examiner*—Michael J. Tokar
*Attorney, Agent, or Firm*—Irving M. Kriegsman

[57] ABSTRACT

A method and apparatus are described for characterizing a semiconductor using the surface photovoltage (SPV) effect. A region of the surface of the semiconductor is illuminated with an intensity modulated beam of light, the wavelength of the light being shorter than that corresponding to the energy gap of the semiconductor. The surface photovoltage (SPV) induced in the semiconductor is measured under bias voltage conditions. The intensity of the light beam and the frequency of modulation are selected such that the surface photovoltage (SPV) is directly proportional to the intensity and reciprocally proportional to the frequency of modulation. Using the surface photovoltage (SPV) and the bias voltage ($V_g$) measurements, the charge induced in the semiconductor space charge region ($Q_{sc}$) and the charge induced in the semiconductor ($Q_{ind}$) are determined. This information is used to determine various parameters of the semiconductor including surface state density and oxide/insulator charge. The technique is designed especially for use in characterizing semiconductor wafers, coated or uncoated, but may, if desired, also be used in characterizing MIS or MOS type semiconductor devices.

9 Claims, 3 Drawing Sheets

NONINVASIVE METHOD AND APPARATUS FOR CHARACTERIZATION OF SEMICONDUCTORS

BACKGROUND OF THE INVENTION

The present invention relates generally to the characterization of semiconductors and more particularly to the characterization of semiconductor materials and devices using an ac surface photovoltage (SPV) method to determine the surface space charge capacitance. The invention is particularly useful in determining parameters such as the surface state density of a semiconductor and/or an oxide/insulator (i.e., an oxide or any other type of insulator,) charge in a dielectric film which may be formed on a semiconductor, either naturally or intentionally (i.e. by thermal oxidation), but, as will hereinafter be pointing out, may be used in determining other parameters of a semiconductor.

As is known the surface state density of a semiconductor is useful, for example, in indicating the quality and contamination of a semiconductor surface or of the interface between the semiconductor and an oxide coating which may be formed on a semiconductor while the oxide/insulator charge is useful in indicating the quality and contamination of the oxide/insulator coating itself.

The surface photovoltage effect as applied to semiconductors and techniques for measuring the (ac) surface photovoltage so as to determine characteristics such as the surface space charge capacitance in general are well known in the art.

Known patents of interest relating to the surface photovoltage effect include U.S. Pat. No. 4,544,887, issued on Oct. 1, 1985 in the name of E. Kamieniecki, which discloses a method of measuring photo-induced voltage at the surface of semiconductor materials (i.e. the surface photovoltage); U.S. Pat. No. 4,286,215, issued on Aug. 25, 1981 in the name of G. L. Miller, which discloses a method and apparatus for the contactless monitoring of the carrier lifetime in semiconductor materials; U.S. Pat. No. 4,333,051, issued on June 1, 1982 in the name of A. M. Goodman, which discloses a method and apparatus for determining minority carrier diffusion length in semiconductors; U.S. Pat. No. 4,433,288, issued on Feb. 21, 1984 in the name of A. R. Moore, which discloses a method and apparatus for determining minority carrier diffusion length in semiconductors; and U.S. Pat. No. 4,663,526, issued on May 5, 1987 in the name of E. Kamieniecki, which discloses a method and apparatus for the nondestructive readout of a latent electrostatic image formed on an insulating material.

Known publications of interest relating to the characterization of semiconductors and/or the surface photovoltage effect in general include Emil Kamieniecki, "Surface Photovoltage Measured Capacitance: Application To Semiconductor/Electrolyte System", J. Appl. Phys. Vol. 54, No. 11, November, 1983, pp. 6481-6487; Emil Kamiencki, "Determination of surface space charge capacitance using a light probe", J. Vac. Sci. Technol., Vol. 20, No. 3, March, 1982, pp. 811-814; Hiromichi Shimizu, Kanji Kinameri, Noriaki Honma and Chusuke Munakata, "Determination of Surface Charge and Interface Trap Densities in Naturally Oxidized n-Type Si Wafers Using ac Surface Photovoltages", Japanese Journal of Applied Physuics, Vol. 26, No. 2, February, 1987, pp. 226-230; A. Ser. Y. H. Tsuo, John A. Moriarty, W. E. Miller and R. K. Crouch, "Si and GaAs Photocapacitive MIS Infrared Detectors", J. Appl. Phys., Vol. 51, No. 4, April 1980, pp. 2137-2148; Olof Engstrom and Annelle Carlsson, "Scanned Light Pulse Technique For the Investigation of Insulator-semiconductor Interfaces", J. Appl. Phys. Vol. 54, No. 9, September, 1983, pp. 5245-5251; E. Thorngren and O. Engstrom, "An Apparatus for the Determination of Ion Drift in MIS Structures", J. Phys. E: Sci, Instrum., Vol. 17, 1984, printed in Great Britain, pp. 1114-1116; E. Kamieniecki and G. Parsons, "Characterization of Semiconductor-Electrolyte System by Surface Photovoltage Measured Capacitance", 164th meeting of the Electrochemical Society, Washington, D. C. October, 1983; R. R. Chang, D. L. Lile and R. Gann, "Remote Gate Capacitance-Voltage Studies for Noninvasive Surface Characterization", Appl. Phys. Lett. Vol. 51, No. 13, Sept. 28, 1987, pp. 987-989; Chusuke Munakata, Shigeru Nishimatsu, Noriaki Honma and Kunihiro Yagi, "Ac Surface Photovoltages in Strongly-Inverted Oxidized p-Type Silicon Wafers", Japanese Journal of Applied Physics, Vol. 23, No. 11, November 1984, pp. 1451-1461; R. S. Nakhmanson, "Frequency Dependence of the Photo-EMF of Strongly Inverted Ge and Si MIS Structures—I. Theory", Solid State Electronics, 1975, Vol 18, pp. 617-626, Pergamon Press, Printed in Great Britain; R. L. Streever, J. J. Winter and F. Rothwarf, "Photovoltage Characterization of MOS Capacitors", Pro. Int. Symp. Silicon Materials Sci & Tech., Philadelphia, May 1977 (Electrochem. Soc. Princeton, 1977) pp. 393-400; R. S. Nakhmanson, Z. Sh. Ovsyuk and L. K. Popov, "Frequency Dependence of Photo-EMF of Strongly Inverted Ge and Si MIS Structures—II Experiments", Solid State Electronics, 1975, Vol. 18, pp. 627-634 Pergamon Press, Printed in Great Britain; Chusuke Munakata and Shigeru Nishimatsu, "Analysis of ac Surface Photovoltages in a Depleted Oxidized p-Type Silicon Wafer", Japanese Journal of applied Physics, Vol 25, No. 6, June, 1966, pp. 807-812; Chusuke Munakata, Mitsuo Nanba and Sunao Matsubara, "Non-Destructive Method of Observing Inhomogeneities in p-n Junctions with a Chopped Photon Beam", Japanese Journal of Applied Physics, Vol. 20, No. 2, February, 1981, pp. L137-L140; Chusuke Munakata and Shigeru Nishimatsu, "Analysis of ac Surface Photovoltages in a Depleted Oxidized p-Type Silicon Wafer", Japanese Journal of Applied Physics, Vol 25, No. 6, June, 1986, pp. 807-812; S. M. Sze, "MIS Diode and Charge-Coupled Device", Physics of Semiconductor Devices, John Wiley & sons Inc. New York 1981, second edition, pp. 362-394.

The front-end of a typical semiconductor device fabrication line involves numerous steps after the initial scrubbing and cleaning of the raw wafer. These steps include oxidation, deposition, masking, diffusion, and implant operations. It can take several weeks from start to finish and testing of the final product. As can be appreciated, process variations which cause yield losses that are detected only at the end of the water fabrication cycle are an economic disaster for manufacturers.

This invention is concerned with a method and apparatus for monitoring contamination and defects of a semiconductor surface (interface) and/or of a dielectric film which may be coating a semiconductor and/or of a device, such as a metal-oxide-semiconductor or a metal-insulator-semiconductor, which includes a layer of semiconductor material. The invention is also applicable to determining the doping type and the doping concentration of a semiconductor in the region adjacent to the (front) surface. One of the most important applications of the technique described in this invention is in connection with silicon device fabrication and in particular monitoring of the oxidation processes used in the fabrication of such devices. However, the technique may also find application in monitoring of other processes such as implantation and diffusion as well as in monitoring processing of semiconductor materials other than silicon, such as for example, gallium arsenide or mercury cadmium telluride.

As will hereinafter be explained, the present invention addresses the use of the (ac) surface photovoltage effect developed under certain specific conditions for the characterization of the bulk and surface (interface) properties of semiconductors. The semiconductor specimen being examined may be bare or may be coated with single layer of dielectric material such as a native oxide (e.g., Si/SiO$_2$) or a multi-layer dielectric coating (e.g., Si/SiO$_2$/polyimide, Si/SiO$_2$/Si$_3$N$_4$, etc.) or may be an MIS (metal-insulator-semiconductor) or MOS (metal-oxide-semiconductor) device. More specifically, the present invention makes use of the known fact that the (ac) surface photovoltage signal (the voltage photoinduced at the surface of a semiconductor) when measured under certain defined conditions is proportional to the reciprocal of the semiconductor space-charge capacitance.

The defined conditions of measurement are as follows: (1) the wavelength of the illuminating light is shorter than that corresponding to the energy gap of the semiconductor material, (2) the light is intensity modulated with the intensity of the light and the frequency of modulation being selected such that the induced (ac) voltage signal is directly proportional to the intensity of light and reciprocally proportional to the frequency of modulation.

When the surface of the specimen is illuminated uniformly this relationship maybe expressed as $$\delta V_s = \frac{\phi(1 - R)}{Kf} q C_{sc}^{-1}$$

where $\delta V_s$ is the surface photovoltage, $C_{sc}$ is the space charge capacitance. $\phi$ is the incident photon flux, R is the reflection coefficient of the semiconductor material, f is the modulation frequency of the light, and q is the electron charge. K is equal to 4 for squarewave modulation of light intensity and is equal to $2\pi$ for sinusoidal modulation. Details on the derivation of this relationship are presented in the above noted paper by Emil Kamieniecki entitled "Determination of Surface Space Charge Capacitance Using A Light Probe" published in the Journal of Vacuum Science Technology, Vol. 20, No. 3, March 1982, pages 811–814. If the illumination of the semiconductor surface is local and not uniform, $\delta V_s$ is determined by using the equation $\delta V_m = (s/S)\delta V_s$ where $V_m$ is the output voltage, s is the area of the illuminated portion (plus diffusion) and S is the total area of the semiconductor. $C_{sc}$ is then determined using the equation noted above.

U.S. Pat. No. 4,544,887, cited above, describes two specific arrangements for measuring the photo-induced voltage at the surface of a specimen of semiconductor material under the conditions noted above, namely, (i) for a specimen of semiconductor material placed in a suitable electrolyte, and (ii) for a specimen of semiconductor material spaced from the reference electrode by an insulating medium such as a gas or a vacuum. However, each arrangement has its shortcomings. The gas or vacuum arrangement is particularly unsatisfactory because of the electrostatic force of attraction between charges induced on opposing faces of the reference electrode and the semiconductor which tend to deflect the semiconductor towards the reference electrode resulting in nonlinearities in the system and the generation of spurious signals while the electrolyte arrangement will cause changes (contamination) in the surface being tested. U.S. Pat. No. 4,544,887 further suggest that the surface photovoltage so determined may be used to characterize properties of a semiconductor material using "conventional" capacitance analysis. However, no method, conventional or nonconventional, which can be used for actually characterizing semiconductor materials once the surface photovoltage has been detected using the disclosed conditions is actually described in the patent. Similar equations establishing the proportionality between the surface photovoltage and the space charge capacitance along with the relation and conditions of measurement in connection with MIS devices are found in the Sher, etc. article noted above and the Nakhamson article (1975), also noted above. Equation 16 in the Nakhamson article deals with the imaginary component of the surface photovoltage signal.

The present invention, as will hereinafter be shown, describes an arrangement for measuring the surface photovoltage in a way which is useful for characterization of semiconductors, especially, but not limited to, semiconductors in the form of wafers and, in addition, describes in detail a method of actually determining a number of parameters of the semiconductor once the surface photovoltage is so obtained, the method for determining the parameters being different from conventional and known capacitance analysis techniques.

As will hereinafter be pointed out, one of the main features of the present technique for characterizing semiconductors by using low intensity modulated light generated during photovoltage involves the use of the dependence of the photovoltage signal so detected on the bias voltage. Another and very important feature is the way in which the parameters of the semiconductor specimen are derived from this dependence.

Measurements of surface photovoltage (generated due to low intensity illumination) versus bias voltage, in general, are very well known. R. L. Streever, J. J. Winter and R. Rothwarf in an article entitled, "Photovoltage Characterization of MOS Capacitors" published in Proc. Int. Symp. Silicon Materials Sci. & Tech., Philadelphia, May 1977 (Electrochem. Soc., Princeton, 1977) pp. 393–400; A. Sher. Y. H. Tsuo, and John A. Mariarty in an article entitled, "Si and GaAs Photocapacitive MIS Infrared Detectors" published in the Journal of applied Physics Vol. 51, No. 4, April 1980, pages 2137–2148; Olof Engstrom and Annelie Carlsson in an article entitled, "Scanned Light Pulse Technique for the Investigation of Insulator-semiconductor Interfaces" published in the Journal of Applied Physics Vol. 54, No. 9, September 1983, pages 5245–5251; and E. Thorngren and O. Engstrom in an article, "An Apparatus for the Determination of Ion Drift in MIS Structures" published in J. Phys. E: Sci. Instrum., Vol. 17, 1984, pp. 1114–1116 all disclose such measurements.

One of the shortcomings with the system disclosed in the above articles is that they are all limited to MIS or MOS structures. The present invention, on the other hand, is not limited to such structures but rather is applicable (1) to arrangements in which a semiconductor wafer (eventually having a dielectric coating) and an insulator which is used to separate the semiconductor from a conductive electrode for SPV testing are separate elements and (2) to MIS or MOS structures, in which the insulator and the semiconductor are a unitary structure (permanently integrated). From the point of view of the system characteristic and method of characterization, the main difference between the arrangement where the semiconductor and the insulator are a unitary structure and the arrangement where the insulator and the semiconductor are separate elements is that the insulator in the unitary structure is much thinner than the insulator in the non-unitary structure. More specifically, while the insulator thickness in MIS/MOS structures is typically around 1000 A or less, the typical thickness of the separately formed insulator arrangement is typically around 10 μm (about 100 times thicker). Therefore to achieve similar changes in the semiconductor space-charge region using a separately formed (thicker) insulator requires about 100 times higher bias voltage (e.g. around 500 volts as opposed to about 5 volts). Because of this much higher bias voltage, the conventional analysis technique used for capacitance-voltage measurements and used for ac surface photovoltage in MIS/MOS structures cannot be used when a thick insulator is being used.

The conventional approach for capacitance-voltage measurements makes use of the distribution of the bias voltage ($V_g$) between the insulator ($V_i$) and the semiconductor ($V_s$) i.e. ($V_g = V_i + V_s$), to evaluate the relation between the surface potential $V_s$ and the applied voltage $V_g$; for conventional capacitance analysis see Chapter 7 of the book by S. M. Sze, noted bive, for surface photovoltage see page 5248 in the paper by Engstrom et al. noted above. With a 10 μm thick insulating spacer (such as a sheet of Mylar) the bias voltage $V_g$ is hundreds of times higher than surface potential $V_s$. Consequently, an error in evaluation of the voltage drop across the insulator ($V_i$) due to e.g., uncertainty in the thickness of the insulating spacer and hence its capacitance $C_i$ ($V_i = Q_{ind}/C_i$ where $Q_{ind}$ is the charge induced in the semiconductor) makes evaluation of the surface potential from the applied voltage impractical.

The measurement of the surface photovoltage versus the combination of the incident light and the modulating frequency of the light is shown in U.S. Pat. No. 4,544,887 noted above.

It is also known to determine the capacitance in a semiconductor for characterization purposes by measuring AC current rather than surface photovoltage.

Accordingly, it is an object of this invention to provide a new and improved method for characterizing semiconductor materials (either coated with an insulator or uncoated) and semiconductor devices using the surface photovoltage effect.

It is a further object of this invention to provide a method and apparatus as described above which involves determining the surface space charge capacitance.

It is another object of this invention to provide a method and apparatus as described above which is specifically suited for use with thick insulators but which can also be used, if desired, with thin insulators.

It is still another object of this invention to provide a method and apparatus as described above which may be used for determining surface state (interface trap) density.

It is yet still another object of this invention to provide a method and apparatus as described above which may be used for determining the oxide/insulator charge.

It is a further object of this invention to provide a method and apparatus as described above which may be used for determining doping type.

It is another object of this invention to provide a method and apparatus as described above which may be used for determining doping concentration.

It is still another object of this invention to provide a method and apparatus as described above which is non-invasive.

It is a further object of this invention to provide a method and apparatus for use in characterizing a semiconductor wafer.

SUMMARY OF THE INVENTION

The present invention makes use of the fact that the photovoltage at the surface of a semiconductor (SPV), measured with low intensity modulated light under certain defined conditions is proportional in a known way to the reciprocal of the space-charge capacitance $C_{sc}$. More specifically, when the surface of the specimen is illuminated uniformly $\delta V_m = \delta V_s$ and $C_{sc}$ is determined by the equation $$\delta V_s = \frac{\phi(1-R)}{Kf} q\, C_{sc}^{-1}$$

where $\delta V_s$ is the surface photovoltage, $C_{sc}$ is the space charge capacitance, $\phi$ is the incident photon flux, R is the reflection coefficient of the semiconductor material, f is the modulation frequency of the light, and q is the electron charge. K is equal to 4 for squarewave modulation of light intensity and is equal to $2\pi$ for sinusoidal modulation. Details on the derivation of the relationship are presented in the paper by Emil Kamieniecki entitled "Determination of Surface Space Charge Capacitance Using a Light Probe" published in the Journal of Vacuum Science Technology, Vol. 20, No. 3, March 1982, pages 811–814. If the illumination of the semiconductor surface is local and not uniform, $\delta V_s$ is determined by using the equation $\delta V_m = (s/S)\delta V_s$ where $\delta V_m$ is the output voltage, s is the area of the illuminated portion (plus diffusion) and S is the total area of the semiconductor. $C_{sc}$ is then determined using the equation noted above.

According to the present invention, the space charge capacitance ($C_{sc}$) when determined under the conditions noted above is used to determine both the surface potential ($V_s$) and the width of the depletion layer and hence the charge induced in the semiconductor space-charge region ($Q_{sc}$). The applied or bias voltage ($V_g$) is used to evaluate the charge induced in the semiconductor ($Q_{ind}$). Using the semiconductor space charge $Q_{sc}$ and the charge induced in the semiconductor $Q_{ind}$ (which is comprised of the changes in the semiconductor space charge and surface charge) various parameters such as surface state density and oxide/insulator charge can be easily and reliable determined.

Various features and advantages will appear from the description to follow. In the description, reference is made to the accompanying drawing which forms a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

Figure 1:
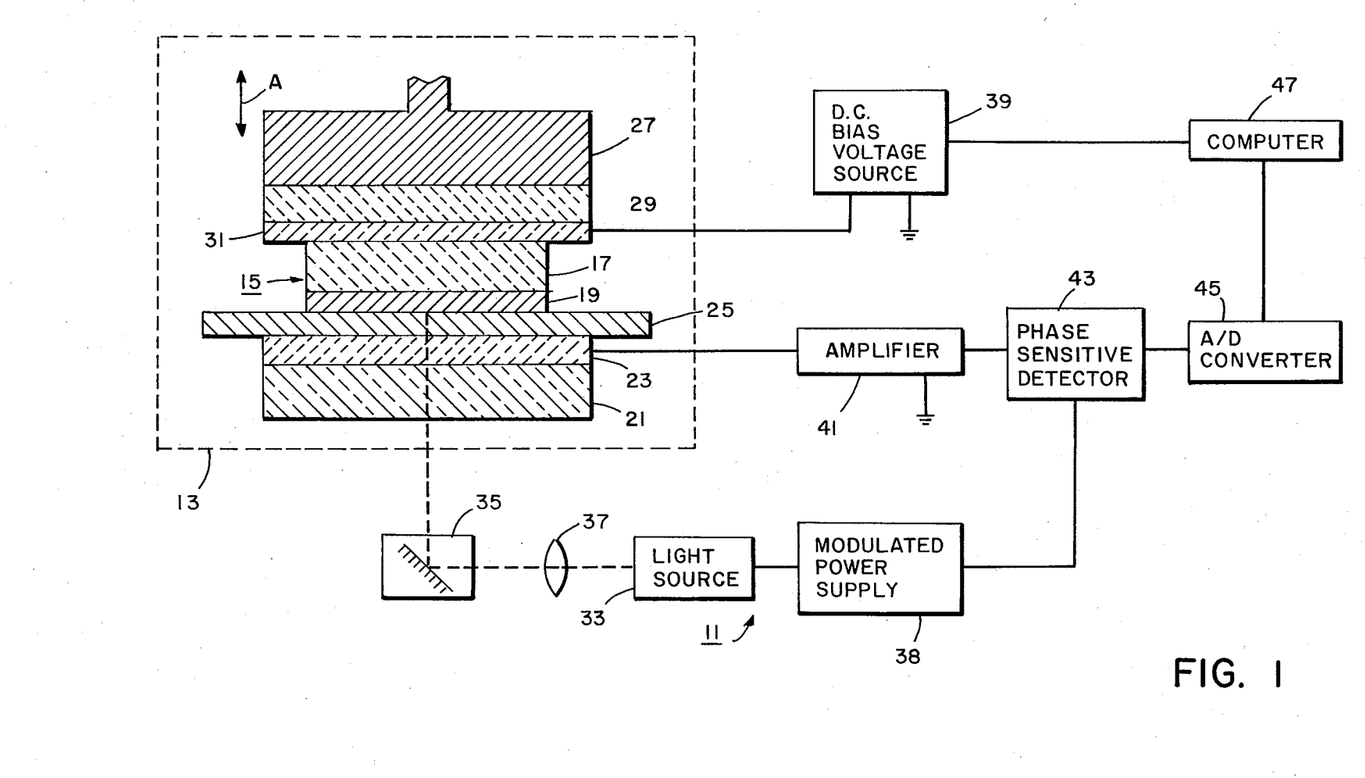
FIG. 1 is a schematic of an apparatus constructed according to the teachings of the present invention.

Referring now to the drawings, there is shown in FIG. 1 a simplified schematic illustration of an apparatus for use in the characterization of a semiconductor constructed according to this invention, the apparatus being identified by reference numeral 11.

Apparatus 11 includes a holder 13 for holding the specimen being examined, the specimen being identified by reference numeral 15. For illustrative purposes, the specimen 15 under examination is a wafer 17 of silicon having an oxide coating 19 (i.e. $SiO_2$) on its front surface.

Holder 13 includes a substrate 21, a reference electrode 23, an insulator 25, a mechanical press 27, a rubber pad 29 and a back contact 31. Substrate 21 which serves as a base is made of glass or other transparent material having good optical quality. Reference electrode 23 is a conductive and transparent coating, such as indium-tin-oxide, which is formed on substrate 21 by any suitable means such as deposition and annealing. Insulator 25 is a sheet of mylar or other equivalent material such as teflon. Rubber pad 29 is fixed to mechanical press 27 by glue, cement or other suitable means. Back contact 31 is a sheet of conductive material, such as aluminum foil and is fixedly attached rubber pad 27 by glue, cement or other suitable means.

Substrate 21 is stationary while press 27 can be moved back and forth from substrate 21 in the direction shown by arrows A.

In use, inslator 25 is placed on reference electrode 23, and specimen 15 positioned on insulator 25 as shown with its oxide coating 19 in contact with insulator 25. Press 27 is then moved toward speciment 15 so that back contact 31 is pressed up against the back surface of speciment 15, as shown. As can be appreciated, insulator 25 prevents leakage between the specimen and reference electrode 23. In addition because specimen 15 is pressed up against reference electrode 23, but separated therefrom by insulator 25, reference electrode 23 and the specimen 15 are maintained parallel to each other.

If the specimen to be examined is an MIS device or an MOS device instead of a wafer, then insulator 25 and reference electrode 23 are eliminated and the specimen placed in holder 23 with the metal layer portion facing substrate 21. In this arrangement, the metal layer portion serves as the reference electrode.

If desired, an insulator made of mylar or other dielectric material may be placed between back contact 31 and the back surface 32 of the specimen 15, for protective purposes.

In the operation of apparatus 11, a collimated beam of light emitted from a source 33 is deflected off of a scanning galvanometer 35 and brought to focus by a lens 37 at the front surface of specimen 15. Source 33 is driven by a modulated power supply 38 so that the output beam that is emitted from source 33 is intensity modulated. Source 33 may comprise a light emitting diode and a collimator. A variable bias voltage is applied to back contact 31 from a DC voltage source 39, which may be a voltage ramp generator or an amplifier with the ramp supplied by a computer 40. The ac photovoltage signal developed across the surface of specimen 15 upon illumination is capacitively picked up by reference electrode 23 and fed into an amplifier 41. The output of amplifier 41 is fed into a phase sensitive detector 43 which is set up so that at deep depletion or inversion one component (i.e. the real component) of the photovoltage signal (SPV) vanishes and the other component (i.e. the imaginary component) which is phase shifted by ninety degrees relative to the impinging light beams (see E. Kamieniecki paper noted above in the journal of applied Physics date November 1983) reaches a maximum. The output of phase sensitive detector 43 is fed into an analog to digital converter (A/D) 45 whose output is fed into computer 40 for processing.

The polarity (i.e. positive or negative) of the surface photovoltage signal (SPV), and especially, the imaginary component thereof, depends on the doping type (p or n) of the specimen and can therefore be used to determine the doping type of the specimen. The change in polarity of the SPV signal results from the difference in the sign of the surface potential barrier under depletion conditions for n and p type semiconductors.

Figure 4:
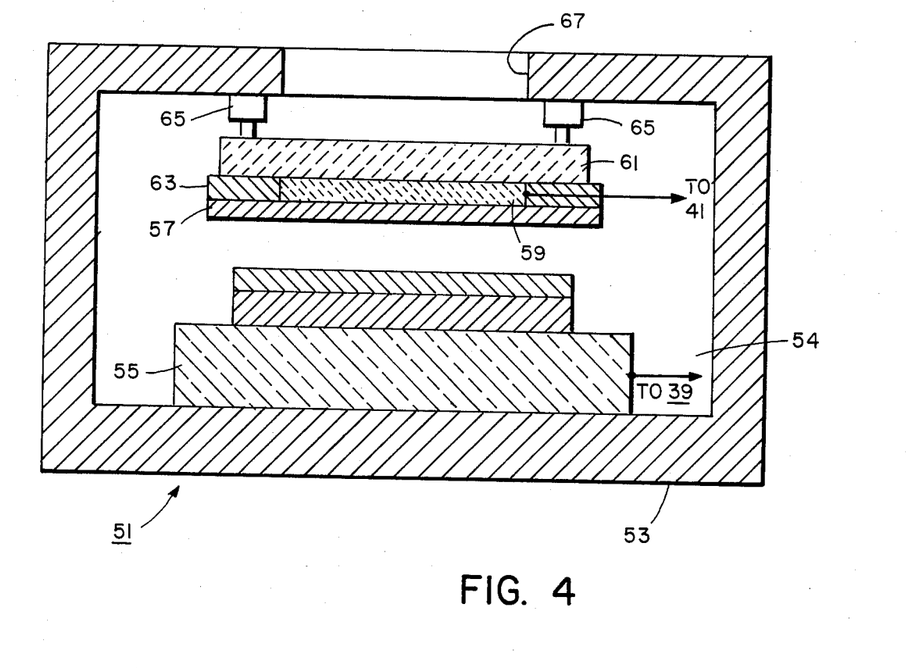
FIG. 4 is a schematic of a modification of the holder portion of the apparatus shown in FIG. 1.

In FIG. 4 there is shown another embodiment of the holder portion of the apparatus, the holder being identified by reference numeral 51. In this arrangement the specimen does not actually come into contact with the insulator separating the specimen from the reference electrode.

Holder 51 includes a support frame 53, which defines a chamber 54 a vacuum chuck 55, an insulator 57, a reference electrode 59, a substrate 61, a plurality of position sensors 63 and a plurality of positioning devices 65.

Support frame 53 includes an opening 67 for the illuminating light beam. Vacuum chuck 55 also serves as a back contact. Specimen 15, as can be seen, is seated on vacuum chuck 55. Insulator 57 may either be sheet of mylar or teflon which is fixed to reference electrode 59 by any suitable means or an insulative coating such as a polyimide which is formed by any suitable means on reference electrode 59. An example of a polyimide is Pyralin made by DuPont. Reference electrode 59 is a conductive and transparent coating which is formed on substrate 61 by any suitable means. Substrate 61 is made of transparent material such as glass. The position sensors 63, which may be capacitive or optical, are attached to substrate 61 and are used to determine the geometric relation between the reference electrode 59 and the semiconductor 15 being examined. The information from sensors 63 is fed into computer 40 and used to control the positioning devices 65 which may be dc motors or piezoelectric translators. Positioning devices 65 are fixed to substrate 61 and are used to angularly move substrate 61 so as to maintain reference electrode 59 and the (front surface of) semiconductor 15 in parallel relationship.

As can be seen, there is a gap between insulator 57 and semiconductor 15. The gap is about 1 μm. Since specimen 15 is held on chuck 55 by a vacuum it will not bend or curl as a result of any electrostatic attraction with the reference electrode 59. Also, by using positioning sensors 63 and positioning devices 65, reference electrode 59 and specimen 15 can be adjusted to the desired separation and maintained parallel. In addition, insulator 57 prevents leakage between reference electrode 59 and the semiconductor 15.

Chamber 54 is preferably flashed with an inert gas such as argon or nitrogen to prevent contamination of the sample.

Figure 2:
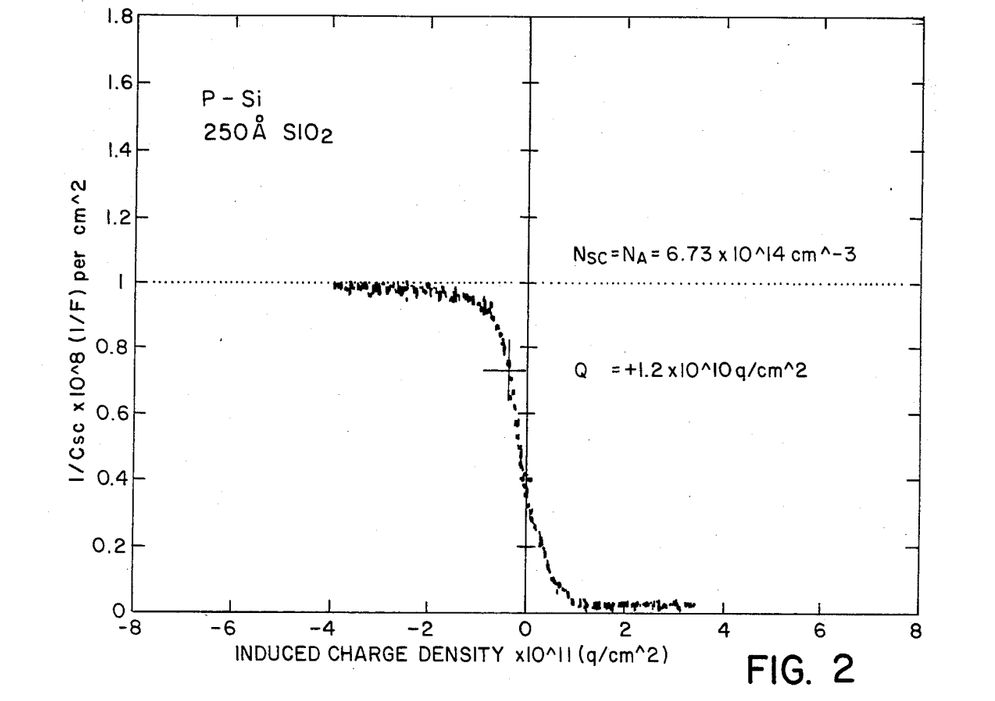
FIG. 2 is a graph of the reciprocal of the space charge capacitance ($1/C_{sc}$) versus induced charge density ($q/cm^2$), for a sample semiconductor.

The results of the surface photovoltage (SPV) measurement for a region of specimen actually examined are presented in the graph shown in FIG. 2 as a dependence of the reciprocal of the space-charge capacitance, $1/C_{sc}$ versus the charge induced in the semiconductor specimen $Q_{ind}$ due to the application of the external DC bias voltage ($V_g$).

The space charge capacitance ($C_{sc}$) is obtained using the equation $$\delta V_s = \frac{\phi(1-R)}{Kf} \times qC_{sc}^{-1}$$

noted above.

$Q_{ind}$ can be determined by measuring the capacitance, ($C_i$), between the specimen and the reference electrode using a conventional capacitance meter and then multiplying the capacitance ($C_i$) by the externally applied dc bias voltage ($V_g$), as shown in the equation below:

$$Q_{ind} = C_i \times V_g$$

The induced charge ($Q_{ind}$) can be also determined by measuring and integrating directly the current charging specimen/reference electrode capacitance. The results shown in the graph in FIG. 2 are for a wafer of p-type silicon ($S_i$) coated by the thermal oxidation with a 250 Å thick layer of $SiO_2$.

The graph in FIG. 2 shows that a plot of $1/C_{sc}$ versus $Q_{ind}$ saturates at high $1/C_{sc}$ values. This saturation is known to correspond to a minimum space-charge capacitance related to a maximum depletion width. The limitation on the maximum value of the depletion-layer width is associated with occurance of the strong inversion at the semiconductor surface. This effect in relation to the conventional capacitance measurements is described in chapter 7 section 7.2.2 of the book "Physics of Semiconductor Devices" by S. M. Sze (John Wiley & Sons Inc., New York 1981, second edition) and for ac surface photovoltage in the article by R. S. Nakhmanson entitled "Frequency dependence of the photo-emf of strongly inverted Ge and Si MIS structures—I. Theory" published in Solid-State Electronics Vol 18, 1975, pages 617–626. Inversion discussed in this paper was actually induced due to the built-in charge (charge in the insulator).

The method of determining of the doping concentration according to this invention will now be explained.

The maximum value of $1/C_{sc}$ is proportional to the maximum depletion layer width, $W_m$, by the equation $(1/C_{sc})_{max} = W_m/\epsilon_s$ where $\epsilon_s$ is the permittivity of the semiconductor. The dependence of $W_m$ and hence $(1/C_{sc})_{max}$ versus doping concentration is discussed for different materials including silicon in Chapter 7 section 7.2.2 of the book "Physics of Semiconductor Devices" by S. M. Sze, John Wiley and Sons Inc., New York 1981, second edition (eq. 28) This relationship may therefore be used to determine doping concentration (in the region adjacent to the surface) of the semiconductor specimen even if the specimen is coated with a dielectric film.

The method of determining the surface (interface) state density according to this invention will now be explained. Under depletion conditions, a change in the dc bias voltage and hence a change of the surface potential leads not only to a change in the semiconductor space charge $Q_{sc}$ (used for determination of the doping concentration) but also to a change of the surface (interface) state charge. Therefore a change of the charge induced in the semiconductor is due to the change of the semiconductor space charge $\Delta Q_{sc}$ and change of the surface (interface) state charge $\Delta Q_{ss}$, $\Delta Q_{ind} = \Delta Q_{sc} + \Delta Q_{ss}$. This relation may be used to determine surface state density. $\Delta Q_{sc}$ can be determined from the change in the value of $1/C_{sc}$, using the equation $\Delta Q_{sc} = qN_{sc}\Delta W$, where $N_{sc}$ is the average doping concentration in the space charge region (which can be determined from $(1/C_{sc})_{max}$). $\Delta W$ is the change in the width of the depletion layer, $\Delta W = \epsilon_s \times \Delta(1/C_{sc})$, and q is an elementary charge. The change of charge in the surface states $\Delta Q_{ss} = \Delta Q_{ind} - \Delta Q_{sc}$. The surface potential, $V_s$, can be determined from the measured value of $1/C_{sc}$ using the equation: $V_s = -\frac{1}{2}q\epsilon_s N_{sc}(1/C_{sc})^2$. Hence the surface state density in the range of surface potentials from $V_{s1}$ to $V_{s2}$ differing by $\Delta V_s$ is, $$D_{it} = \Delta Q_{ss}/q\Delta V_s$$

The energy levels of these states can be calculated knowing the surface potential and the Fermi level (see e.g. Sze book noted above).

Figure 3:
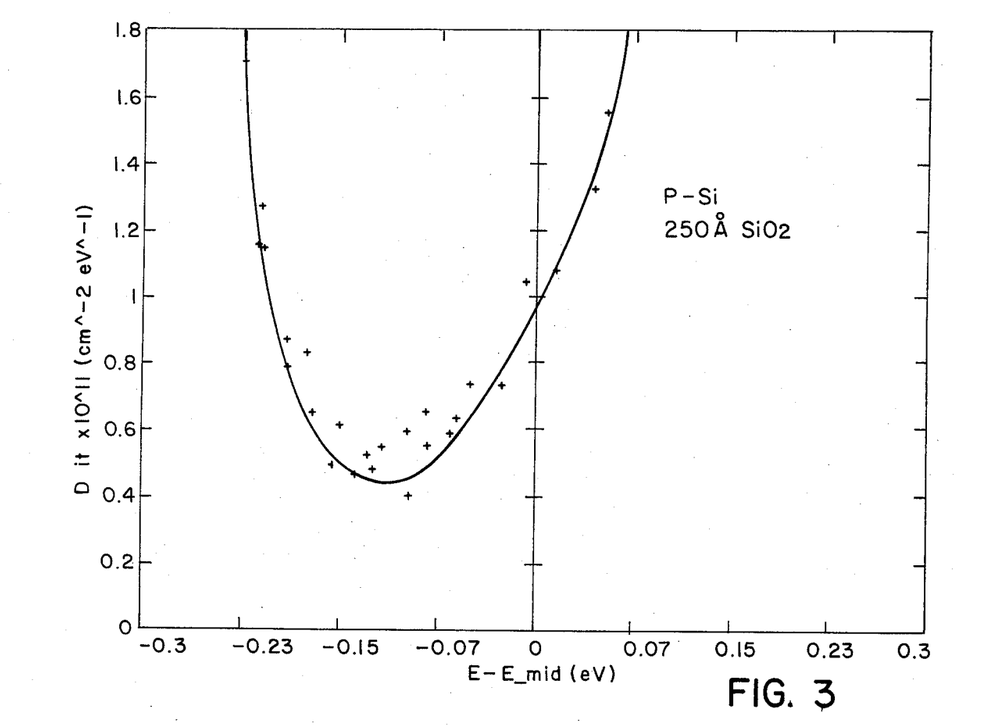
FIG. 3 is a graph of surface state density versus energy in the band gap for a sample semiconductor.

It should be noted that determination of the surface state density from the SPV method according to this invention is more accurate than from the capacitance/conductance measurements because of the substantial simplification of the equivalent circuit as discussed by Emil Kamieniecki in the article dated November, 1983 noted above. The interface state density for the sample plotted in FIG. 2 is shown in FIG. 3.

The method of determining the oxide/insulator charge (charge in the dielectric film such as an oxide) according to this invention will now be explained.

In the absence of the external bias voltage, the semiconductor/interface/oxide (insulator) system is neutral. Since the reference electrode is far away its disturbance can be neglected. Therefore, $Q_{ox} = -Q_{sc}(V_g=0) - Q_{ss}(V_g=0)$ At some bias voltage $V_g$ the charge induced in the semiconductor/insulator (oxide) system is given by the equation:

$$Q_{ind} = [Q_{sc} - Q_{sc}(V_g=0)] + [Q_{ss} - Q_{ss}(V_g=0)],$$

where $Q_{ind}$, $Q_{sc}$ and $Q_{ss}$ are the values at the bias voltage, and it is assumed that the total charge i the oxide is not changing due to external voltage (charge may move in the insulator/oxide-mobile charge, but may not be injected; if it is injected from the semiconductor than this change is attributed to charging of the surface states) From the above equations.

$$Q_{ox} = Q_{ind} - Q_{sc} - Q_{ss} \qquad 5$$

The bias voltage can be selected for instance in such a way that Fermi Level coincides with the middle of the band gap or minimum in the density of the surface state (see e.g. Sze book). This can be realized by determining surface potential corresponding to the value $q^*abs(V_s) = E_{G/2} - E_F$, where $E_G$ is the bandgap of the semiconductor $E_F$ is the absolute value of the Fermi energy related to the appropriate band edge (conduction band for n-type, valence band for p-type): from that we can determine space charge capacitance at this surface potential using equation $V_s = -\frac{1}{2}q\epsilon_s N_{sc}(1/C_{sc})^2$. The induced charge corresponding to this space charge capacitance can be determined from the measurements shown in FIG. 2. If we assume that the surface state charge for the Fermi Level coinciding with the middle of the band gap (or minimum of the surface state density) is vanishing, then $$Q_{ox} = Q_{ind} - Q_{sc}. \qquad 25$$

It should be noted that oxide charge measured this way represents total charge in the oxide. This is unlike conventional capacitance methods where the measured oxide charge represents the charge located in the oxide region adjacent to the semiconductor. This difference between the method of this invention and the conventional capacitance methods may be of importance for determination of the total contamination of the dielectric layer (e.g. $SiO_2$ on Si).

The embodiments of the present invention are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A method of determining the surface state density of a specimen of semiconductor material in a range of surface potentials $V_{s1}$ to $V_{s2}$ differing by $\Delta V_s$, the specimen having a known energy gap and having a surface arranged for illumination, the method comprising:
   a. providing a pair of electrodes,
   b. positioning the specimen between the pair of electrodes,
   c. illuminating a region of the surface of the specimen arranged for illumination with a beam of light of wavelengths shorter than that of the energy gap of the semiconductor and being intensity modulated at a predetermined frequency,
   d. applying a variable bias voltage ($V_g$) between the pair of electrodes,
   e. providing a signal $\delta V_s$ representing the surface photovoltage (SPV) induced at the region of the specimen illuminated by the light beam,
   f. the intensity of the light beam and frequency of modulation of the light beam selected so that the surface photovoltage (SPV) is directly proportional to the intensity of the light beam and reciprocally proportional to the frequency of modulation of the light beam,
   g. determining the space charge capacitance ($C_{sc}$) from measured surface photovoltage (SPV),
   h. determining the charge induced in the semiconductor space-charge region ($Q_{sc}$) from the space charge capacitance ($C_{sc}$),
   i. determining the charge induced in the semiconductor ($Q_{ind}$) from the bias voltage ($V_g$), and then
   j. determining the surface state density using $Q_{ind}$, $Q_{sc}$ and $V_s$.

2. A method of determining the surface state density of a specimen of semiconductor material in a range of surface potentials $V_{s1}$ to $V_{s2}$ differing by $\Delta V_s$, the specimen having a known energy gap and having a surface arranged for illumination, the method comprising:
   a. providing a pair of electrodes,
   b. positioning the specimen between the pair of electrodes,
   c. illuminating a region of the surface of the specimen arranged for illumination with a beam of light of wavelengths shorter than that of the energy gap of the semiconductor, the beam of light being intensity modulated at a predetermined frequency,
   d. applying a variable bias voltage ($V_g$) between the pair of electrodes,
   e. providing a signal $\delta V_s$ representing the surface photovoltage (SPV) induced at the region of the specimen illuminated by the light beam,
   f. the intensity of the light beam and frequency of modulation of the light beam being selected so that the surface photovoltage (SPV) is directly proportional to the intensity of the light beam and reciprocally proportional to the frequency of modulation of the light beam,
   g. determining the space charge capacitance ($C_{sc}$) from the signal representing the surface photovoltage (SPV) using the equation $$\delta V_s = \frac{\phi(1-R)}{Kf} \times qC_{sc}^{-1}$$

where $\phi$ is the incident photon flux, R is the reflection coefficient of the specimen, f is the modulation frequency, q is an elementary charge and K is 4 if the intensity modulation is square wave and $2\pi$ if it is sinusoidal,
   h. determining the change in the width of the depletion layer $\Delta W$ using the equation $\Delta W = \epsilon_s \times \Delta(1/c_{sc})$ where $\epsilon_s$ is the permittivity of the semiconductor,
   i. determining the change of the semiconductor space-charge $\Delta Q_{sc}$, using the equation $\Delta Q_{sc} = qN_{sc}\Delta W$, where $N_{sc}$ is the average doping concentration in the space charge region and q is an elementary charge,
   j. determining the charge induced in the semiconductor ($Q_{ind}$) from the bias voltage ($V_g$),
   k. determining the change of the surface state charge $\Delta Q_{ss}$ using the equation $\Delta Q_{ss} = \Delta Q_{ind} - \Delta Q_{sc}$, and then,
   l. determining the surface state density $D_{it}$ using the equation $D_{it} = \Delta Q_{ss}/q\Delta V_s$, where ss is equal to the change in the charge of the surface state, $V_s$ is equal to the change in the surface potential and q is an elementary charge.

3. A method of determining the value of the charge, $Q_{ox}$, in the oxide/insulator which is on a surface of a specimen of semiconductor material, the specimen having a known energy gap and having the surface under examination arranged for illumination, the method comprising:
a. providing a pair of electrodes,
b. positioning the specimen between the pair of electrodes,
c. illuminating a region of the surface of the specimen with a beam of light of a wavelength shorter than that of the energy gap of the semiconductor and being intensity modulated at a predetermined frequency,
d. applying a variable bias voltage ($V_g$) between the pair of electrodes,
e. providing a signal $\delta V_s$ representing the surface photovoltage (SPV) induced at the region of the specimen illuminated by the light beam,
f. the intensity of the light beam and frequency of modulation of the light beam being selected so that the surface photovoltage (SPV) is directly proportional to the intensity of the light beam and reciprocally proportional to the frequency of modulation of the light beam,
g. determining the space charge capacitance ($C_{sc}$) from measured surface photovoltage (SPV),
h. determining the charge induced in the semiconductor space-charge region ($Q_{sc}$) from the space charge capacitance ($C_{sc}$),
i. determining the charge induced in the semiconductor ($Q_{ind}$) from the bias voltage ($V_g$), and then
j. determining the oxide charge, $Q_{ox}$, using $Q_{ind}$ and $Q_{sc}$ where $Q_{ind}$ and $Q_{sc}$ are the induced charge in the semiconductor and the charge in the space charge region, respectively at the bias voltage.

4. A method of determining the doping type of a specimen of semiconductor material having a known energy gap and having a surface arranged for illumination, the method comprising:
a. providing a pair of electrodes,
b. positioning the specimen between the pair of electrodes,
c. illuminating a region of the surface of the specimen arranged for illumination with a beam of light of wavelengths shorter than that of the energy gap of the semiconductor and being intensity modulated at a predetermined frequency,
d. applying a variable bias voltage ($V_g$) between the pair of electrodes to the semiconductor,
e. providing a signal $\delta V_s$ representing surface photovoltage (SPV) induced at the region of the specimen illuminated by the light beam,
f. the intensity of the light beam and frequency of modulation of the light beam being selected so that the surface photovoltage (SPV) is directly proportional to the intensity of the light beam and reciprocally proportional to the frequency of modulation of the light beam, and
g. the SPV signal having a real component and an imaginary component, the polarity of the imaginary component being related to the doping type.

5. A method of determining the doping concentration of a specimen of semiconductor material having a known energy gap and having a surface arranged for illumination, the method comprising:
a. providing a pair of electrodes,
b. positioning the specimen between the pair of electrodes,
c. illuminating a region of the surface of the specimen arranged for illumination with a beam of light of wavelengths shorter than that of the energy gap of the semiconductor and intensity modulated at a predetermined frequency,
d. applying a variable bias voltage ($V_g$) between the pair of electrodes,
e. providing a signal $\delta V_s$ representing the surface photovoltage (SPV) induced at the region of the specimen illuminated by the light beam,
f. the intensity of the light beam and frequency of modulation of the light beam being selected so that the surface photovoltage (SPV) is directly proportional to the intensity of the light beam and reciprocally proportional to the frequency of modulation of the light beam,
g. determining the space charge capacitance ($C_{sc}$) from measured surface photovoltage (SPV), and then
h. determining the doping concentration using $C_{sc}$.

6. A method of determining the value of the charge, $Q_{ox}$, in the oxide/insulator which is on a surface of a specimen of semiconductor material, the specimen having a known energy gap and the surface being arranged for illumination, the method comprising:
a. providing a pair of electrodes,
b. positioning the specimen between the pair of electrodes,
c. illuminating a region of the surface of the specimen with a beam of light wavelengths shorter than that of the energy gap of the semiconductor, the beam of light being intensity modulated at a predetermined frequency,
d. applying a variable bias voltage ($V_g$) between the pair of electrodes,
e. providing a signal $\delta V_s$ representing the surface photovoltage (SPV) induced at the region of the specimen illuminated by the light beam,
f. the intensity of the light beam and frequency of modulation of the light beam being selected so that the surface photovoltage (SPV) is directly proportional to the intensity of the light beam and reciprocally proportional to the frequency of modulation of the light beam,
g. determining the space charge capacitance ($C_{sc}$) from the signal representing the surface photovoltage (SPV) using the equation $$\delta V_s = \frac{\phi(1-R)}{Kf} \times qC_{sc}^{-1}$$

where is the incident photon flex, R is the reflection coefficient of the specimen, f is the modulation frequency q is an elementary charge and K is 4 if the intensity modulation is square wave and $2\pi$ if it is sinusoidal,
h. determining the semiconductor space-charge ($Q_{sc}$) from the space charge capacitance ($C_{sc}$), using the equation $Q_{sc} = qN_{sc}W$ where $N_{sc}$ is the average doping concentration in the space charge region, W is width of the depletion layer and q is an elementary charge,
i. determining the charge induced in the semiconductor ($Q_{ind}$) from the bias voltage ($V_g$), and then,
j. determining the oxide/insulator charge using the equation $Q_{ox} = Q_{ind} - Q_{sc}$ where $Q_{ind}$ and $Q_{sc}$ are the induced charge in the specimen and the semiconductor space charge, respectively.

7. A method of determining the doping type of a specimen of semiconductor material, the specimen having energy gap and having a first surface arranged for illumination, the method comprising:
   a. providing a pair of electrodes,
   b. positioning the specimen between the pair of electrodes,
   c. illuminating a region of the first surface of the specimen with a bea of light of wavelengths shorter than that of the energy gap of the semiconductor, the beam of light being intensity modulated at a predetermined frequency,
   d. applying a variable bias voltage ($V_g$) to the specimen, and
   e. providing a signal $\delta V_s$ representing the surface photovoltage (SPV) induced at the region of the specimen illuminated by the light beam, the signal having a real component and an imaginary component,
   f. the intensity of the light beam and frequency of modulation of the light beam being selected so that the surface photovoltage (SPV) is directly proportional to the intensity of the light beam and reciprocally proportional to the frequency of modulation of the light beam,
   g. the polarity of the imaginary component being related to the doping type.

8. A method of determining the doping concentration of a specimen of semiconductor material, the specimen having a known energy gap and having a first surface arranged for illumination, the method comprising:
   a. providing a pair of electrodes,
   b. position the specimen between the pair of electrodes,
   c. illuminating a region of the first surface of the specimen with a beam of light of wavelengths shorter than that of the energy gap of the semiconductor, the beam of light being intensity modulated at a predetermined frequency,
   d. applying a variable bias voltage ($V_g$) between the two electrodes,
   e. providing a signal $\delta V_s$ representing the surface photovoltage (SPV) induced at the region of the specimen illuminated by the light beam,
   f. the intensity of the light beam and frequency of modulation of the light beam being selected so that the surface photovoltage (SPV) is directly proportional to the intensity of the light beam and reciprocally proportional to the frequency of modulation of the light beam,
   g. determining the space charge capacitance ($C_{sc}$ from the signal representing the surface photovoltage (SPV) using the equation $$\delta V_s = \frac{\phi(1-R)}{Kf} \times qC_{sc}^{-1},$$

where $\phi$ is the incident photon flux, R is the reflection coefficient of the specimen, f is the modulation frequency, q is an elementary charge and K is 4 if the intensity modulation is square wave and $2\pi$ if it is sinusoidal,
   h. determining the maximum depletion layer width $W_m$ using the equation $(1/C_{sc})_{max} = W_m \epsilon_s$, where $\epsilon_s$ is the permittivity of the specimen, and then
   i. determining the doping concentration using $W_m$.

9. The method of claim 1 and wherein $Q_{ind}$ is determined by multiplying the capacitance $C_i$ between the specimen and a reference electrode used to provide the signal $\delta V_s$ by the bias voltage $V_g$.

* * * * *